(12) United States Patent
Wong et al.

(10) Patent No.: US 8,669,828 B1
(45) Date of Patent: Mar. 11, 2014

(54) DECOUPLING CAPACITOR CONTROL CIRCUITRY

(75) Inventors: Wilson Wong, San Francisco, CA (US); Allen Chan, San Jose, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 552 days.

(21) Appl. No.: 12/909,739

(22) Filed: Oct. 21, 2010

(51) Int. Cl.
*H04B 3/28* (2006.01)

(52) U.S. Cl.
USPC .......................................... 333/12; 333/24 C (58) Field of Classification Search
USPC .............. 327/538–543, 387; 307/98, 99, 109, 307/112; 324/537, 548; 361/15, 306.2; 333/12, 24 C
See application file for complete search history.

(56) References Cited

U.S. PATENT DOCUMENTS

| | | | |
|---|---|---|---|
| 3,621,387 A * | 11/1971 | Smith et al. ................... | 324/73.1 |
| 5,304,506 A | 4/1994 | Porter et al. | |
| 5,506,457 A | 4/1996 | Krauter et al. | |
| 5,789,964 A | 8/1998 | Voldman | |
| 6,038,122 A | 3/2000 | Bergstedt et al. | |
| 6,424,058 B1 | 7/2002 | Frech et al. | |
| 7,414,459 B2 * | 8/2008 | Pisasale et al. ............... | 327/543 |

OTHER PUBLICATIONS

D. Inglis, L. Manchanda, R. Comizzoli, A. Dickinson, E. Martin, S. Mdndis, P. Silverman, G. Weber, B. Ackland, L. O'Gorman, "A Robust 1.8V 250 micro W Direct-Contact 500 dpi Fingerprint Sensor", Digest of Technical Papers, 1998 IEEE International Solid-State Circuits Conference, pp. 284-285.*
Rahim, Irfan, et al., U.S. Appl. No. 12/332,928, filed Dec. 11, 2008.
Tan, Chee Hong, U.S. Appl. No. 12/717,796, filed Mar. 4, 2010.

* cited by examiner

*Primary Examiner* — Robert Pascal
*Assistant Examiner* — Kimberly Glenn
(74) *Attorney, Agent, or Firm* — Treyz Law Group; Jason Tsai (57) ABSTRACT

Integrated circuits with decoupling capacitor circuitry are provided. Decoupling capacitor circuitry may include multiple arrays of decoupling capacitors. Each decoupling capacitor array may have a corresponding decoupling capacitor monitoring circuit that is associated with that decoupling capacitor array. Each decoupling capacitor monitoring circuit may include a resistor and switching circuitry. Each decoupling capacitor monitoring circuit may be coupled to a comparator and control circuitry. During testing, the control circuitry may configure each decoupling capacitor array for leakage current testing one at a time. If a decoupling capacitor array is determined to exhibit excessive leakage currents, that decoupling capacitor array will be marked as defective and will be disabled from use. If the decoupling capacitor array is determined to exhibit tolerable leakage currents, that decoupling capacitor array will be enable for use to help reduce power supply noise.

20 Claims, 6 Drawing Sheets

DECOUPLING CAPACITOR CONTROL CIRCUITRY

BACKGROUND

This relates generally to integrated circuits, and more particularly, to integrated circuits with decoupling capacitors.

Decoupling capacitors are often used to help provide more stable power supply voltages to circuitry on integrated circuits. Decoupling capacitors allow high frequency noise on direct current (DC) power supply lines to be shunted directly between the power supply lines, thereby preventing the noise from reaching powered circuit components. In a scenario in which a power supply is required to switch between various modes of operation, an adequate decoupling capacitance can act as an energy reserve that lessens the magnitude of undesired dips in power supply voltage during mode switching events.

Advances in integrated circuit design require power supplies to supply stable power for integrated circuits operating at high data rates and clock speeds. This requires increasing amounts of decoupling capacitance per integrated circuit area. A large decoupling capacitance could occupy a disproportionate amount of valuable surface area on an integrated circuit.

Conventional on-chip decoupling capacitors may be vulnerable to faults (defects). If a fault shorts a decoupling capacitor, an unacceptably large current could flow across the shorted capacitor rendering the integrated circuit unusable. Such a fault could arise during production or in the field as a result of a latent dielectric defect. As larger and larger decoupling capacitor arrays are implemented on integrated circuits, the chances that an integrated circuit will suffer from this type of defect will increase, resulting in an undesirable decrease in integrated circuit yield.

It would therefore be desirable to provide improved integrated circuit decoupling capacitor circuitry.

SUMMARY

Integrated circuits may include decoupling capacitor circuitry. The decoupling capacitor circuitry may include groups of decoupling capacitors that reduce the amount of power supply noise present on power supply lines. Control circuitry in the decoupling capacitor circuitry may be used to switch leaky blocks of decoupling capacitors out of use.

Decoupling capacitors may be organized in groups (sometimes referred to as blocks). The decoupling capacitors in each block may be arranged in an array with multiple rows and columns of decoupling capacitors. The decoupling capacitor blocks may have different sizes and shapes and may exhibit different capacitance values. The control circuitry may include switching circuitry, a control circuit, and a comparator circuit. Each block of decoupling capacitors may have an associated load such as a resistor. The switching circuitry and load associated with each block may be configured to serve as a monitoring circuit that provides information on the leakage current properties of that block to the comparator circuit. The monitoring circuits and the comparator circuit function as leakage current monitoring circuitry that identifies leaky blocks.

In response to detection of leaky blocks of decoupling capacitors, the control circuit may configure the switching circuitry to switch leaky blocks out of use.

During monitoring operations, the decoupling capacitor monitoring circuit associated with each decoupling capacitor block may be selectively coupled to a first input of the comparator circuit (e.g., an amplifier that is configured to serve as a comparator). For example, during testing of a first decoupling capacitor block, a first decoupling capacitor monitoring circuit that is associated with the first decoupling capacitor block may be coupled to the first input of the comparator. During testing of a second decoupling capacitor block, a second decoupling capacitor monitoring circuit that is associated with the second decoupling capacitor block may be coupled to the first input of the comparator.

The comparator may have a second input that receives a reference voltage from control circuitry. During testing of a given decoupling capacitor block, if the voltage level received at the first input of the comparator is greater than or equal to the voltage level of the reference voltage, the comparator will generate a high output signal (e.g., indicating that the given decoupling capacitor block is defective, because it supplies excessive leakage current). If the voltage level received at the first input of the comparator is less than the voltage level of the reference voltage, the comparator will generate a low output signal (e.g., indicating that the given decoupling capacitor block is functioning properly, because it supplies an acceptable amount of leakage).

The decoupling capacitor blocks may be tested one at a time to determine whether each decoupling capacitor block is defective. Defective decoupling capacitor blocks may be switched out of use (e.g., decoupled from ground), whereas decoupling capacitor blocks that satisfy design criteria may be switched in use (e.g., turned on to provide power supply noise reduction).

The amount of leakage present in each defective decoupling capacitor block may be quantified. The leakage current threshold that is used to determine whether a particular decoupling capacitor block is defective may be user-programmable. A total leakage current may be calculated by combining the leakage currents in each defective decoupling capacitor block. If the total leakage current is unacceptable, that integrated circuit is marked as defective. If the total leakage current satisfies design criteria, that integrated circuit is marked as a passing integrated circuit.

Further features of the present invention, its nature and various advantages will be more apparent from the accompanying drawings and the following detailed description.

DETAILED DESCRIPTION

This relates integrated circuits with decoupling capacitor circuitry. Integrated circuits include on-chip circuitry that is powered using external power supplies. The external power supplies may be used to supply integrated circuits with power supply voltages. It is generally desirable to maintain the power supply voltages at constant voltage levels.

The amount of power drawn from a power supply may vary during normal operation of an integrated circuit. To accommodate this type of changing power demands while maintaining constant power supply voltage levels, the integrated circuit may include decoupling capacitor circuitry. The decoupling capacitor circuitry may serve as a local energy storage reserve that provides instantaneous current draw. Providing current using the decoupling capacitor circuitry may reduce power supply noise.

Figure 1:
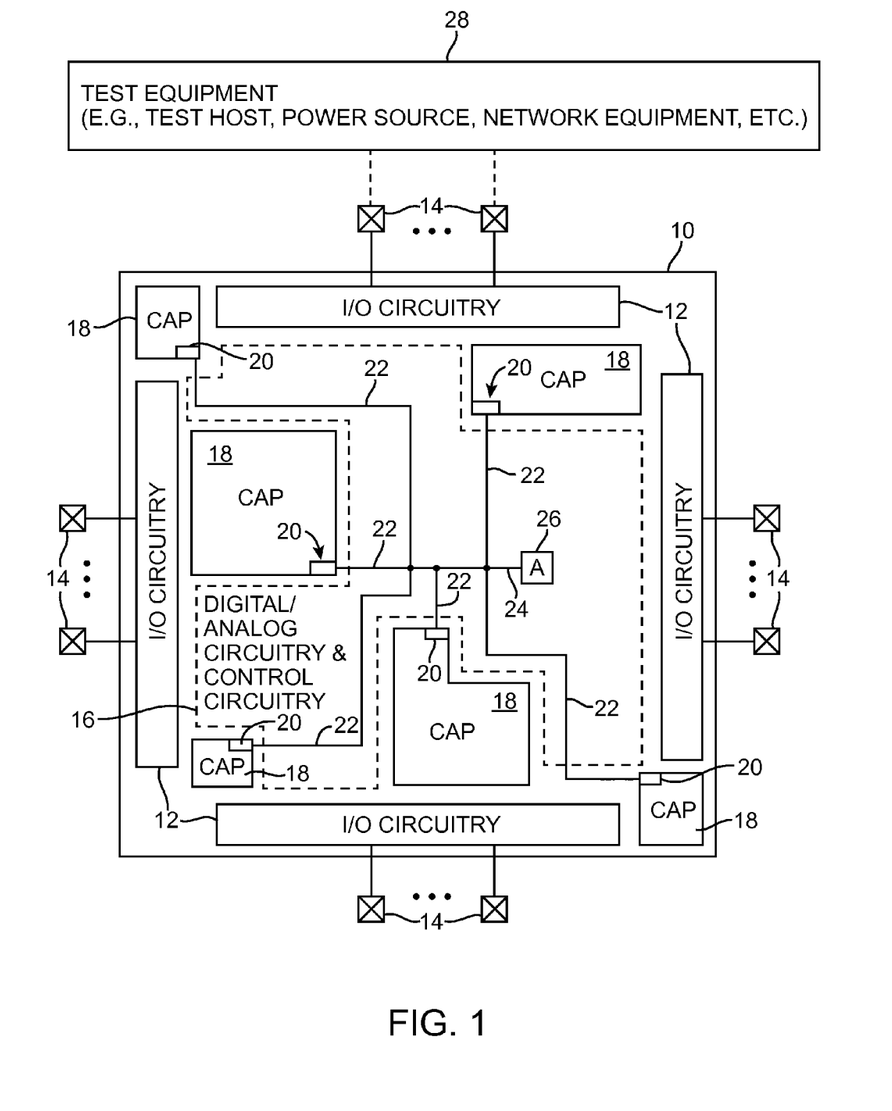
FIG. 1 is a diagram of an illustrative integrated circuit with decoupling capacitor circuitry in accordance with an embodiment of the present invention.

FIG. 1 shows an integrated circuit that includes internal circuitry such as digital/analog circuitry and control circuitry 16. Integrated circuit 10 may include memory chips, digital signal processing circuits, microprocessors, application specific integrated circuits, programmable integrated circuits, or other suitable integrated circuits.

As shown in FIG. 1, integrated circuit 10 may include input-output (I/O) circuitry such as I/O circuitry 12 formed along each edge of integrated circuit 10. Circuitry 12 may be used for driving signals off of device 10 and for receiving signals from other devices via I/O pins 14. During test operations, integrated circuit 10 may be coupled to test equipment such as test equipment 28 through pins 14. For example, test equipment 28 may include a test host, power source, network equipment, etc.

Integrated circuit 10 may include blocks of decoupling capacitors such as decoupling capacitor blocks 18. Decoupling capacitor blocks 18 may each include an array of capacitors. As shown in FIG. 1, decoupling capacitor blocks 18 of varying configurations (e.g., decoupling capacitor blocks 18 of different sizes and shapes) may be formed on device 10. Decoupling capacitor blocks 18 may be formed adjacent to I/O circuitry 12, adjacent to circuits 16 that are sensitive to power supply variation, or at any desired location on device 10. Tens or hundreds of decoupling capacitor array blocks 18 may be formed on device 10, if desired.

Decoupling capacitor blocks 18 may serve to reduce power supply variation. For example, consider a scenario in which an external power source supplies a 1.2 V positive power supply voltage to device 10 through pins 14. Device 10 may include communications circuitry 16 operating at high data rates (e.g., data rates greater than 1 Gbps). During an idle mode, communications circuitry 16 may draw 0.5 A of current from the power source (as an example). During transmit mode, the communications circuitry may draw 0.7 A of current from the power source. During the mode switch from the idle mode to the transmit mode, decoupling capacitor block 18 located adjacent to communications circuitry 16 on device 10 may serve to provide 0.2 A of current (0.7-0.5) so that communications circuitry 16 receives a constant positive supply voltage of 1.2 V.

Consider another scenario in which the positive power supply experiences an instantaneous voltage glitch. Decoupling capacitor blocks 18 may dampen or absorb this glitch by providing instantaneous current to internal circuitry 16 so that the positive power supply voltage received at the local power supply terminal of circuitry 16 remains constant at 1.2 V (as an example). Decoupling capacitor circuitry 18 used to maintain constant power supply voltage while supplying the desired current draw may be referred to as a ballasting circuit.

Decoupling capacitor blocks 18 formed on device 10 may have large dimensions. For example, a single decoupling capacitor array 18 may measure 400 µm by 200 µm and may have one hundred or more, one thousand or more, or ten thousand or more, individual capacitor cells. As the size of decoupling capacitor circuitry 18 increases in modern integrated circuits, the probability of a manufacturing defect (or fault) in decoupling capacitor circuitry 18 increases.

A defective decoupling capacitor may behave like a resistor that shorts a positive power supply line (e.g., a power supply terminal on which the positive power supply voltage is conveyed) to ground. In conventional integrated circuits, shorting the positive power supply line to ground with a faulty decoupling capacitor may undesirably generate significant amounts of leakage current, resulting in a voltage droop in the positive power supply voltage. Excessive amounts of leakage generated in the presence of a decoupling capacitor defect may render an integrated circuit inoperable. Decoupling capacitor circuitry size increases may therefore reduce yield in conventional integrated circuits.

In an effort to counteract this decrease in yield, decoupling capacitor blocks 18 may each include a decoupling capacitor monitoring circuit such as decoupling capacitor monitoring circuit 20 (see, e.g., FIG. 1). Each decoupling capacitor block 18 may have an associated decoupling capacitor monitoring circuit 20. Each monitoring circuit 20 may have an output that is connected to input 24 of amplifier 26 through path 22. Amplifier 26 may be a comparator circuit that generates a high output signal if the signal at input 24 is higher than a predetermined threshold voltage or a low output signal if the signal at input 24 is lower than the predetermined threshold voltage.

A given monitoring circuit 20 and comparator 26 may serve to determine whether decoupling capacitor block 18 that is associated with given monitoring circuit 20 is defective (e.g., by monitoring the leakage current generated by that decoupling capacitor block).

For example, if a decoupling capacitor block is determined to be faulty, that decoupling capacitor block will be disabled (e.g., the decoupling capacitor block will be decoupled from ground). If a decoupling capacitor block is determined to function properly, then that decoupling capacitor block will be enabled (e.g., the decoupling capacitor block will be coupled to ground and can therefore be used to reduce power supply noise).

Figure 2:
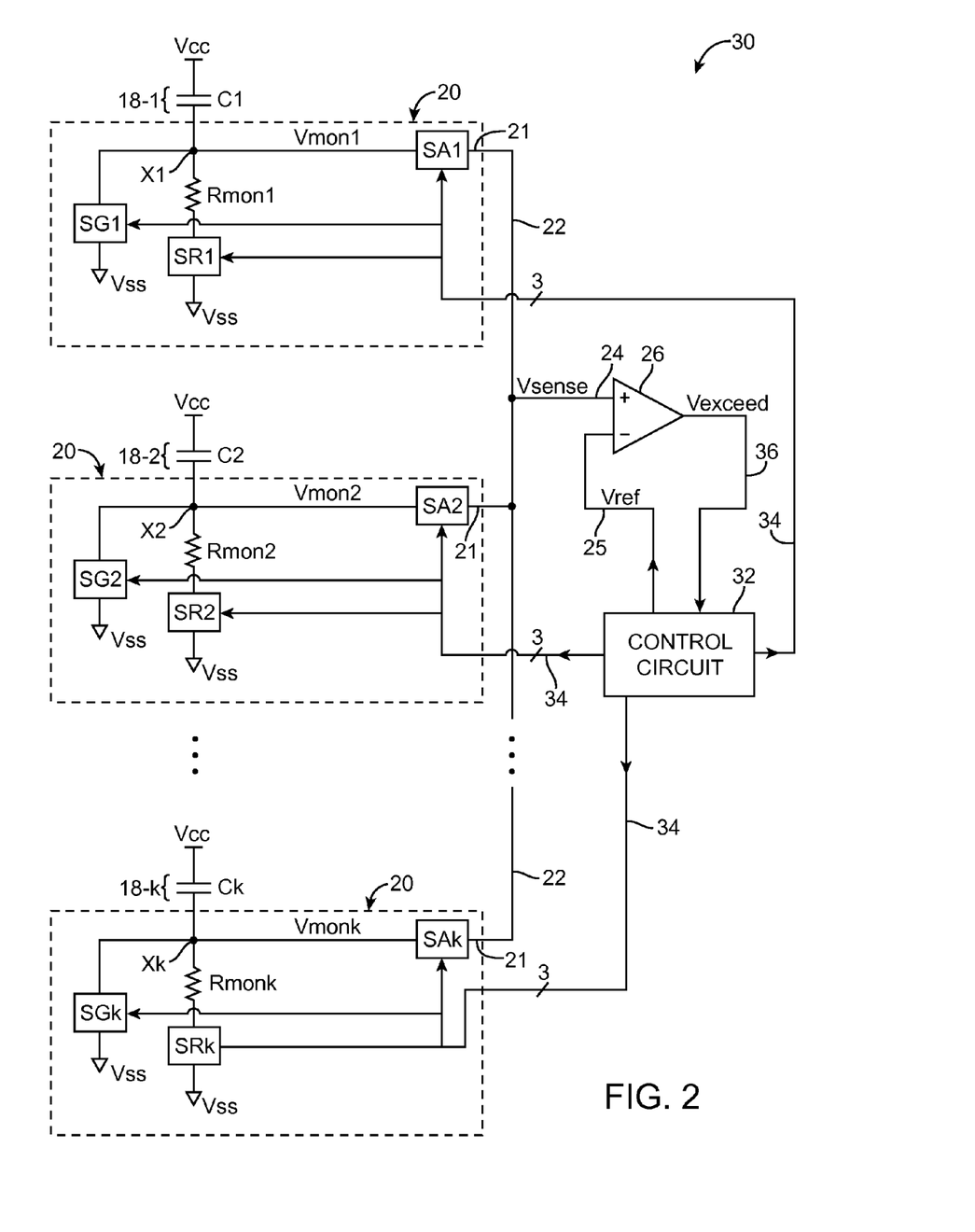
FIG. 2 is a circuit diagram of illustrative decoupling capacitor monitoring circuitry in accordance with an embodiment of the present invention.

FIG. 2 is a circuit diagram that illustrates how respective decoupling capacitor monitoring circuits 20 may be coupled to amplifier 26. Decoupling capacitor blocks 18, monitoring circuits 20 associated with blocks 18, and amplifier 26 may collectively be referred to as decoupling capacitor circuitry 30.

As shown in FIG. 2, each decoupling capacitor monitoring circuit 20 may include a monitoring resistor such as resistor Rmon, a resistor switch such as switch SR, a ground switch such as switch SG, and an amplifier switch such as switch SA. Each decoupling capacitor block 18 and associated monitoring circuit 20 may be coupled in series between a positive power supply line (e.g., a power supply terminal on which positive power supply voltage Vcc is conveyed) and a ground line (e.g., a ground power supply terminal on which ground power supply voltage Vss is conveyed).

For example, a first decoupling capacitor block 18-1 may be represented by a capacitor with capacitance C1 in FIG. 2. Decoupling capacitor block 18-1 may be coupled between the positive power supply line and a first intermediate node X1. First decoupling capacitor monitoring circuit 20 that is associated with decoupling capacitor block 18-1 may include resistor Rmon1 and switches SR1, SG1, and SA1. Resistor Rmon1 and switch SR1 may be connected in series between node X1 and the ground line. Switch SG1 may be connected between node X1 and the ground line. Intermediate node X1 may be coupled to output 21 of first monitoring circuit 20 through switch SA1. Signal Vmon1 represents the voltage level at intermediate node X1.

A second decoupling capacitor block 18-2 may be represented by a capacitor with capacitance C2 in FIG. 2. Decoupling capacitor block 18-2 may be coupled between the positive power supply line and a second intermediate node X2. Second decoupling capacitor monitoring circuit 20 that is associated with decoupling capacitor block 18-2 may include resistor Rmon2 and switches SR2, SG2, and SA2. Resistor Rmon2 and switch SR2 may be connected in series between node X2 and the ground line. Switch SG2 may be connected between node X2 and the ground line. Intermediate node X2 may be coupled to output 21 of second monitoring circuit 20 through switch SA2. Signal Vmon2 represents the voltage level at intermediate node X2.

Decoupling capacitor circuitry 30 may include k sets of decoupling capacitor blocks and associated monitoring circuits, as shown in FIG. 2. The $k^{th}$ decoupling capacitor block 18-k may be represented by a capacitor with capacitance Ck in FIG. 2. Decoupling capacitor block 18-k may be coupled between the positive power supply line and a second intermediate node Xk. $K^{th}$ decoupling capacitor monitoring circuit 20 that is associated with decoupling capacitor block 18-k may include resistor Rmonk and switches SRk, SGk, and SAk. Resistor Rmonk and switch SRk may be connected in series between node Xk and the ground line. Switch SGk may be connected between node Xk and the ground line. Intermediate node Xk may be coupled to output 21 of $k^{th}$ monitoring circuit 20 through switch SAk. Signal Vmonk represents the voltage level at intermediate node Xk. Circuitry 30 may include any suitable number of decoupling capacitor blocks 18 and associated decoupling capacitor monitoring circuits 20.

Outputs 21 of each decoupling capacitor monitoring circuit 20 may be fed to a first input ("positive" input) 24 of comparator 26 over path 22. Sensing signal Vsense may be received at input 24 of comparator 26. A selected one of decoupling capacitor monitoring circuits 20 may be coupled to input 24. For example, switch SA1 of first decoupling capacitor monitoring circuit 20 may be turned on to route signal Vmon1 to input 24 (i.e., signal Vsense will be equal to Vmon1) while amplifier switches SA2-SAk of remaining monitoring circuits are turned off during testing of first decoupling capacitor block 18-1. During testing of second decoupling capacitor block 18-2, switch SA2 of second decoupling capacitor monitoring circuit 20 may be enabled to route signal Vmon2 to input 24 (i.e., signal Vsense will be equal to Vmon2) while amplifier switches (i.e., switches SA1 and SA3-SAk) of remaining monitoring circuits are disabled. Testing of each decoupling capacitor block 18 may be performed one at a time using this approach.

As shown in FIG. 2, comparator 26 may have a second input ("negative" input) 25. Second input 25 may be connected to control circuit 32. Control circuit 32 may be part of decoupling capacitor circuitry 30. Control circuit 32, monitoring circuits 20, and comparator circuit 26 may collectively be referred to as control circuitry.

Input 25 may receive reference signal Vref from control circuit 32. If the voltage level of signal Vsense at positive input 24 is greater than the voltage level of signal Vref at negative input 25, comparator 26 will output a high signal (e.g., signal Vexceed will be high) on output 36. If the voltage level of signal Vsense at positive input 24 is less than the voltage level of signal Vref at negative input 25, comparator 26 will output a low signal (e.g., signal Vexceed will be low) on output 36.

Signal Vexceed may be fed to a control input of control circuit 32 over line 36. Each decoupling capacitor monitoring circuit 20 may receive control signals from control circuit 32 over control lines 34 (see, e.g., FIG. 2). The control signals conveyed over lines 34 may serve to selectively enable and disable the different switches (e.g., amplifier switches SA1-SAk, resistor switches SR1-SRk, and ground switches SG1-SGk) during testing of decoupling capacitor blocks 18.

Each decoupling capacitor block 18 may have different capacitance values depending on its capacitor array size. For example, decoupling capacitor block 18-1 may have a first capacitance value C1 of 1000 pF, whereas decoupling capacitor block 18-2 may have a second capacitance value C2 of 1500 pF, etc. The decoupling capacitors in decoupling capacitor blocks 18 may be formed using metal-oxide-metal (MOM) capacitor configurations (sometimes referred to as metal-insulator-metal or MIM capacitors) or other suitable types of on-chip capacitor configurations.

Reference voltage Vref may have a nominal voltage level of 0.5 V (as an example). In this example, if Vsense is equal to or greater than 0.5 V, Vexceed will be high. If Vsense is less than 0.5 V, Vexceed will be low. Reference voltage Vref may be greater than 0.5 V or less than 0.5 V, if desired.

Assume, for example, that a predetermined current threshold for a first faulty decoupling capacitor block 18-1 is configured to be equal to 0.5 mA (e.g., if decoupling capacitor block 18-1 supplies 0.5 mA or more than 0.5 mA of current during testing, decoupling capacitor block 18-1 is determined to be defective). This threshold may be reconfigured by a user of device 10. Associated Rmon1 may therefore have a resistance value of 1000 ohms so that signal Vmon1 will have a voltage value that is equal to or greater than Vref if decoupling capacitor block 18-1 is leaky (e.g., faulty decoupling capacitor block 18-1 will supply at least 0.5 mA of current, thereby generating at least 0.5 V at Vmon1 if Rmon1 is equal to 1000 Ohms).

The predetermined current threshold for a second faulty decoupling capacitor block 18-2 that is twice the size of faulty decoupling capacitor block 18-1 may be configured to be equal to 1 mA (two times 0.5 mA), because decoupling capacitor block 18-2 can supply twice the amount of current (e.g., if decoupling capacitor block 18-2 supplies 1 mA or more than 1 mA of current during testing, decoupling capacitor block 18-2 is determined to be defective). Associated Rmon2 may therefore have a resistance value of 500 ohms so that signal Vmon2 will have a voltage value that is equal to or greater than Vref if decoupling capacitor block 18-2 is leaky (e.g., faulty decoupling capacitor block 18-2 will supply at least 1 mA of current, thereby generating at least 0.5 V at Vmon2 if Rmon2 is equal to 500 Ohms).

The resistors (e.g., Rmon1, Rmon2, . . . , Rmonk) in the respective decoupling capacitor blocks 18 may therefore have different resistance values. The resistance values may be inversely proportional to the capacitance of the associated decoupling capacitor block 18. For example, if the capacitance of a given decoupling capacitor array is doubled, the resistance of associated resistor Rmon will be halved.

The resistors may be formed using squares of polysilicon formed on a semiconductor substrate. Each square of polysilicon may, for example, measure 0.4 µm by 0.4 µm and may have a resistance of 500 ohms/square. In the example above, the 1000 ohm resistor will be formed from two squares of polysilicon, whereas 500 ohm resistor will be formed from one square of polysilicon. Resistors Rmon1-Rmonk may be formed using metal paths or other types of resistive paths, if desired.

The switches of each monitoring circuit 20 (i.e., switches SA1-SAk, SR1-SRk, and SG1-SGk) may each be a single n-channel transistor, a transmission gate (e.g., a switch formed using an n-channel transistor and a p-channel transistor connected in parallel), a single p-channel transistor, or other types of switching circuitry. The transistors used to form the switching circuitry may be transistors that have minimum transistor widths, as an example.

The area overhead of the decoupling capacitor monitoring circuitry (e.g., monitoring circuits 20, amplifier 26, and control circuit 32) is small in comparison to the area of the different decoupling capacitor arrays 18. For example, the total area of the decoupling capacitor monitoring circuitry may be less than 1% of the area of decoupling capacitor blocks 18.

Figure 3:
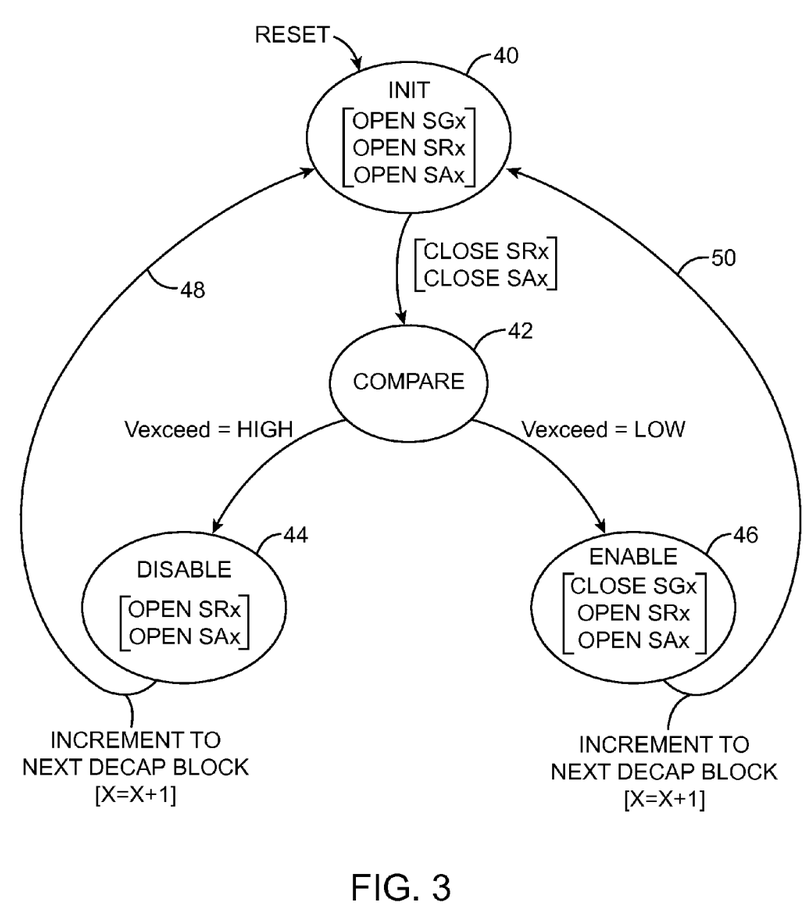
FIG. 3 is a diagram showing different states involved in controlling the decoupling capacitor monitoring circuitry of FIG. 2 in accordance with an embodiment of the present invention.

FIG. 3 is a state diagram showing the operation of control circuit 32 during testing of device 10. Upon device startup (reset), control circuit 32 may be placed in an initial state 40. At state 40, the switches of a selected decoupling capacitor monitoring circuit 20 may be configured in an open state (e.g., switches SGx, SRx, and SAx are turned off).

Switches SRx and SAx may be configured in a closed state (i.e., turned on) when transitioning from initial state 40 to compare state 42. In compare state 42, comparator 26 may receive Vmonx from the corresponding monitoring circuit 20 at its first input 24 and Vref at second input 25. If Vmonx is greater than or equal to Vref, comparator 26 may output signal Vexceed having a logic value of "1." If Vmonx is less than Vref, comparator 26 may output signal Vexceed having a logic value of "0."

If Vexceed is high, circuit 32 will be placed in disable state 44. At state 44, switches SRx and SAx are opened (i.e., turned off). Switch SGx will not be enabled, because the associated decoupling capacitor block 18 is determined to be defective, as indicated by a high Vexceed. Processing may loop back to state 40 to test a successive decoupling capacitor block 18, as indicated by path 48.

If Vexceed is low, circuit 32 will be placed in enable state 46. At state 46, switches SRx and SAx are disabled. Switch SGx will be enabled, because the associated decoupling capacitor block 18 satisfies design criteria, as indicated by a low Vexceed. Processing may loop back to state 40 to test a successive decoupling capacitor block 18, as indicated by path 50.

Figure 4:
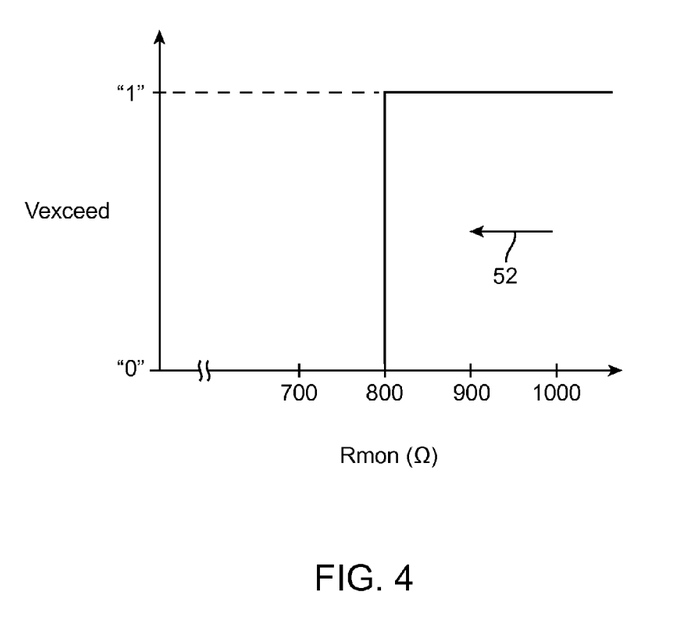
FIG. 4 is a graph illustrating how the resistance of a monitoring resistor may be swept to quantify leakage currents in accordance with an embodiment of the present invention.

A high Vexceed indicates that a given decoupling capacitor block 18 under test exhibits excessive leakage. It may be desirable to measure and quantify the amount of leakage current in each decoupling capacitor block 18. Resistors Rmon1-Rmonk may be tunable resistors (e.g., voltage-controlled-resistor circuits). Quantifying the amount of leakage current can be performed by adjusting the amount of resistance, as shown in FIG. 4.

For example, consider a scenario in which Vref is equal to 0.5 V, resistor Rmon has a nominal value of 1000 ohms, and a selected decoupling capacitor block supplies 0.625 mA of leakage current. A Vsense of 0.625 V ($1000*0.625*10^{-3}$) may be received at input 24 of comparator 26. Because Vsense of 0.625 V is greater than Vref of 0.5 V, comparator 26 will generate a high Vexceed, indicating that an undesirable amount of leakage is detected. The user may not be able to determine the exact amount of leakage simply based on the polarity of Vexceed, because signal Vsense is not accessible to the user.

The exact amount of leakage may be determined by adjusting the resistance of Rmon. The resistance of Rmon may be gradually reduced from its nominal value in the direction of arrow 52 until signal Vexceed is driven low. In the example of FIG. 4, signal Vexceed falls low when Rmon is equal to 800 ohms (sometimes referred to as a critical resistance value). The exact amount of leakage can be determined by dividing Vref by the critical resistance value. In this example, the exact amount of leakage in the given decoupling capacitor block 18 has a calculated value of 0.625 mA (0.5 divided by 800), which is consistent with the original assumption.

Figure 5:
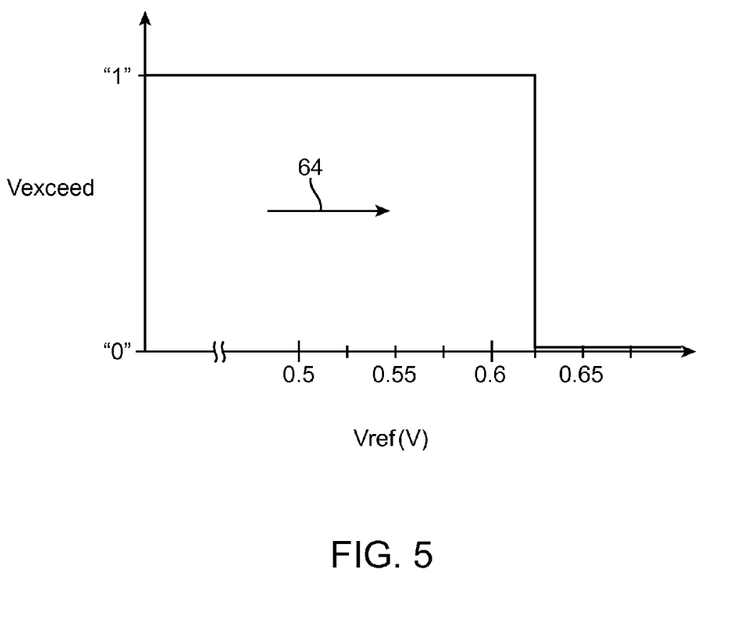
FIG. 5 is a graph illustrating how the voltage level of a reference voltage may be swept to quantify leakage currents in accordance with an embodiment of the present invention.

Quantifying the amount of leakage current can also be performed by adjusting signal Vref, as shown in FIG. 5. For example, consider a scenario in which Vref is nominally equal to 0.5 V, resistor Rmon has a nominal value of 1000 ohms, and a selected decoupling capacitor block supplies 0.625 mA of leakage current. A Vsense of 0.625 V ($1000*0.625*10^{-3}$) may be received at input 24 of comparator 26. Because Vsense of 0.625 V is greater than Vref of 0.5 V, comparator 26 will generate a high Vexceed, indicating that an undesirable amount of leakage is detected. Similarly, the user may not be able to determine the exact amount of leakage simply based on the polarity of Vexceed, because signal Vsense is not accessible to the user.

The exact amount of leakage may be determined by adjusting the magnitude of Vref. The value of Vref may be gradually increased beyond its nominal value in the direction of arrow 64 until signal Vexceed is driven low. In the example of FIG. 5, signal Vexceed falls low when Vref is equal to 0.625 V (sometimes referred to as a critical reference voltage level). The exact amount of leakage can be determined by dividing the critical reference voltage by the nominal resistance of Rmon. In this example, the exact amount of leakage in the given decoupling capacitor block 18 has a calculated value of 0.625 mA (0.625 divided by 1000), which is consistent with the original assumption.

The leakage threshold (e.g., the amount of leakage acceptable in each decoupling capacitor block 18) may be configured by the user of device 10. The leakage threshold may be programmable by adjusting Vref or changing the values of Rmon1-Rmonk. For example, a user may increase the value of Vref or decrease Rmon to increase the leakage threshold (e.g., a higher amount of leakage currents must be detected in order to render a decoupling capacitor block defective). A user may decrease the value of Vref or increase Rmon to lower the leakage threshold (e.g., to accept less leakage), if desired.

Figure 6:
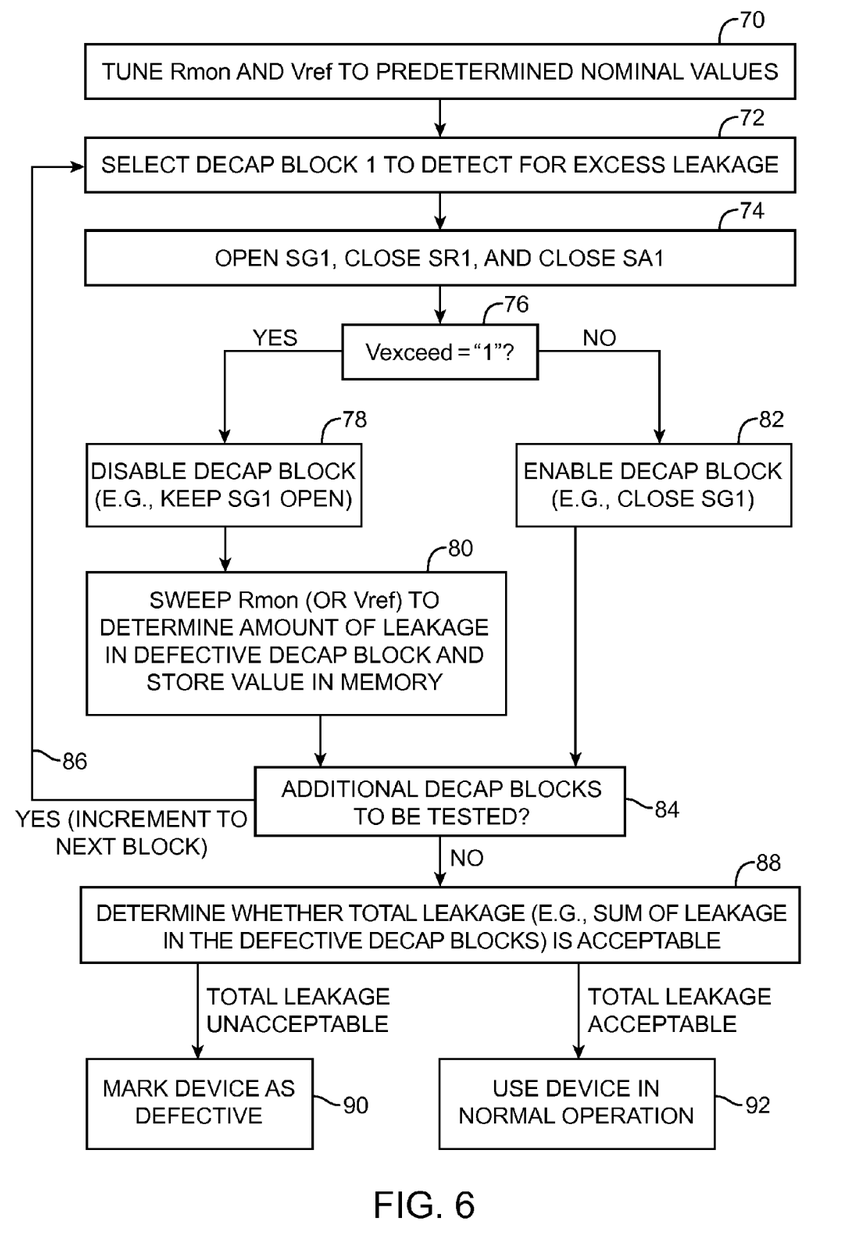
FIG. 6 is a flow chart of illustrative steps involved in operating the decoupling capacitor monitoring circuitry of the type shown in connection with FIG. 2 in accordance with an embodiment of the present invention.

FIG. 6 is a flow chart showing illustrative steps involved in operating decoupling capacitor circuitry 30 of the type described in connection with FIG. 2. At step 70, resistors Rmon1-Rmonk and signal Vref may be adjusted to desired nominal values.

At step 72, a first decoupling capacitor block may be selected to detect for excess leakage. Decoupling capacitor monitoring circuit 20 that is associated with the first decoupling capacitor may include switches SG1, SR1, SA1, and Rmon1. At step 74, switch SG1 is disabled, while switches SR1 and SA1 are enabled. In response to enabling switch SA1, comparator 26 may either output a high Vexceed or a low Vexceed.

If Vexceed is high, the first decoupling capacitor block is determined to be defective and will be disabled by keeping switch SG1 in the off state (e.g., the first decoupling capacitor placed in this floating state becomes inoperable) (step 78). At step 80, Rmon or Vref may optionally be swept as described in FIGS. 4 and 5 to determine the exact amount of leakage in the first decoupling capacitor block. The calculated leakage may be stored in the memory of device 10. If desired, the calculated leakage may be stored in test equipment 28 of FIG. 1.

If Vexceed is low, the first decoupling capacitor block is determined to be satisfactory and will be enabled by placing switch SG1 in the on state (e.g., the first decoupling capacitor that is coupled to ground through SG1 may serve to reduce power supply noise) (step 82).

At step 84, processing may loop back to step 72 if there are additional decoupling capacitor blocks to be tested, as indicated by path 86. At step 88, test equipment 28 may determine whether the total amount of leakage (e.g., the sum of all the leakage current in each defective decoupling capacitor block calculated during step 80) is acceptable. If the total leakage fails to satisfy design criteria, device 10 is marked as defective (step 90). If the total leakage is determined to be acceptable, device 10 may be marked as a passing device (step 92).

The foregoing is merely illustrative of the principles of this invention and various modifications can be made by those skilled in the art without departing from the scope and spirit of the invention.

What is claimed is:

1. A method of using groups of decoupling capacitors on an integrated circuit, comprising:
   with control circuitry, determining whether the groups of decoupling capacitors exhibit undesired amounts of leakage current, wherein the control circuitry includes switching circuitry and wherein determining whether the groups of decoupling capacitors exhibit undesired amounts of leakage comprises selectively coupling each of the groups of decoupling capacitors to a comparator;
   in response to determining that a given group of the decoupling capacitors is exhibiting an undesired amount of leakage current, switching that group of decoupling capacitors out of use; and
   with the comparator, comparing a leakage signal associated with each of the selectively coupled groups of decoupling capacitors to a reference.

2. The method defined in claim 1 further comprising:
   with the control circuitry, switching each group of decoupling capacitors for which the compared leakage signal is greater than the reference out of use and switching each group of decoupling capacitors for which the compared leakage signal is less than the reference into use.

3. The method defined in claim 1 further comprising adjusting the reference to quantify the leakage signals.

4. The method defined in claim 3 further comprising:
   with the control circuitry, determining whether the integrated circuit is operating satisfactorily by processing quantified leakage signals measured from the groups of decoupling capacitors.

5. An integrated circuit comprising:
   a positive power supply terminal;
   a ground power supply terminal;
   a plurality of groups of decoupling capacitors, wherein each group of decoupling capacitors includes an associated load circuit; and
   control circuitry that selectively switches at least one of the plurality of groups of the decoupling capacitors out of use while remaining groups of the decoupling capacitors reduce noise on the positive and ground power supply terminals.

6. The integrated circuit defined in claim 5 wherein each group of decoupling capacitors has an associated switch that is selectively operable in a closed state and an open state, wherein the group of decoupling capacitors is shorted between the positive power supply terminal and the ground power supply terminal when the switch is in the closed state, and wherein the group of decoupling capacitors is not shorted between the positive power supply terminal and the ground power supply terminal when the switch is in the open state.

7. The integrated circuit defined in claim 6 wherein the control circuitry closes the switches associated with the remaining groups of decoupling capacitors and opens the switch associated with the group of decoupling capacitors that is switched out of use.

8. The integrated circuit defined in claim 5 wherein the control circuitry includes a comparator circuit that receives leakage current signals from the groups of decoupling capacitors.

9. The integrated circuit defined in claim 8 wherein the control circuitry is configured to provide a reference signal to the comparator circuit.

10. The integrated circuit defined in claim 5, wherein the load circuit in each group of decoupling capacitors comprises a resistor, wherein the control circuitry includes a comparator circuit, and wherein each resistor is selectively coupled to the comparator circuit through a respective switch.

11. The integrated circuit defined in claim 5 wherein each group of decoupling capacitors has an associated first switch that is connected in series with the decoupling capacitors between the positive power supply terminal and the ground supply terminal and has an associated second switch that selectively couples that group of decoupling capacitors to a comparator circuit.

12. The integrated circuit defined in claim 11 wherein each group of decoupling capacitors has an associated resistor and an associated third switch that are connected in series with the decoupling capacitors between the positive power supply terminal and the ground supply terminal.

13. The integrated circuit defined in claim 12 wherein the resistor associated with each group of decoupling capacitors comprises an adjustable resistor.

14. The integrated circuit defined in claim 12 wherein the control circuitry is configured to provide a tunable reference signal to the comparator circuit.

15. The integrated circuit defined in claim 5 wherein each group of decoupling capacitors comprises an array of at least one thousand metal-insulator-metal capacitors.

16. An integrated circuit comprising:
   first and second power supply terminals;
   a plurality of blocks of decoupling capacitors;
   a first plurality of switches each of which is coupled in series between the first and second power supply terminals with a respective one of the plurality of blocks of decoupling capacitors; and
   a second plurality of switches each of which is coupled in parallel with a respective one of the first plurality of switches.

17. The integrated circuit defined in claim 14 further comprising:
   a control circuit that closes at least some of the first plurality of switches while opening at least one of the first plurality of switches.

18. The integrated circuit defined in claim 14 further comprising control circuitry that is configured to measure a leakage current signal associated with each of the plurality of blocks of decoupling capacitors.

19. The integrated circuit defined in claim 14 further comprising:
   a control circuit that closes some of the first plurality of switches while each of the second plurality of switches is opened.

20. The integrated circuit defined in claim 14 further comprising:
   a comparator; and a third plurality of switches each of which is coupled between the comparator and a respective block of decoupling capacitors in the plurality of blocks of decoupling capacitors.

* * * * *